United States Patent
Grezes-Besset

(10) Patent No.: US 6,620,249 B2
(45) Date of Patent: Sep. 16, 2003

(54) METHOD AND APPARATUS FOR DEPOSITING THIN LAYERS

(75) Inventor: Catherine Grezes-Besset, Marseilles (FR)

(73) Assignee: Highwave Optical Technologies, Marseilles ( * ) Notice: Subject to any disclaimer, the term of this patent is extended or adjusted under 35 U.S.C. 154(b) by 0 days.

(21) Appl. No.: 10/015,820

(22) Filed: Nov. 1, 2001

(65) Prior Publication Data
US 2002/0068126 A1 Jun. 6, 2002

(30) Foreign Application Priority Data
Nov. 16, 2000 (FR) .............................. 00 14775

(51) Int. Cl.$^7$ ............................ B05C 11/00; C23C 16/52
(52) U.S. Cl. .................... 118/713; 118/708; 118/712; 118/723 VE; 118/723 EB; 118/730
(58) Field of Search ............................ 118/712, 708, 118/695, 696, 713, 714, 715, 723 VE, 723 CB, 723 EB, 726, 727, 730

(56) References Cited

U.S. PATENT DOCUMENTS

| | | | | |
|---|---|---|---|---|
| 4,049,352 A | * | 9/1977 | Lardon et al. | 356/73 |
| 4,311,725 A | * | 1/1982 | Holland | 427/10 |
| 4,430,959 A | * | 2/1984 | Ebata et al. | 118/697 |
| 4,582,431 A | | 4/1986 | Cole | 356/382 |
| 5,354,575 A | | 10/1994 | Dagenais et al. | 427/10 |
| 5,425,964 A | | 6/1995 | Southwell et al. | 427/10 |
| 5,656,138 A | * | 8/1997 | Scobey et al. | 204/192.12 |
| 5,863,379 A | * | 1/1999 | Uchida et al. | 156/378 |
| 6,338,775 B1 | * | 1/2002 | Chen | 204/192.11 |
| 6,344,084 B1 | * | 2/2002 | Koinuma et al. | 117/201 |
| 6,513,451 B2 | * | 2/2003 | Van Slyke et al. | 118/723 VE |
| 2002/0139666 A1 | * | 10/2002 | Hsueh et al. | 204/298.03 |

FOREIGN PATENT DOCUMENTS

| | | |
|---|---|---|
| FR | 2281996 | 3/1976 |
| JP | 55076064 | 6/1980 |

OTHER PUBLICATIONS

Patent Abstracts of Japan Publication No. 55076064 dated Jun. 7, 1980.
Zhou, Z.H., et al. "Real–time in situ epitaxial film thickness monitoring and control using an emission . . . spectrometer" Journal of Vacuum Science & Technology A., vol. 12, No. 4, p. 1938–1942, (1994).

* cited by examiner

Primary Examiner—Jeffrie R. Lund
Assistant Examiner—Rudy Zervigon
(74) Attorney, Agent, or Firm—Ladas and Parry

(57) ABSTRACT

The present invention relates to a method and to apparatus for depositing thin layers. The technical field of the invention is that of manufacturing thin layer optical devices. In the invention, apparatus for depositing thin layers on a plurality of substrates comprises means for producing a light beam for monitoring the optical thicknesses of the substrates.

21 Claims, 2 Drawing Sheets

METHOD AND APPARATUS FOR DEPOSITING THIN LAYERS

The present invention relates to a method and to apparatus for depositing thin layers.

The technical field of the invention is that of manufacturing thin-layer optical devices.

The invention applies in particular to fabricating optical filters essentially constituted by a stack of thin layers deposited in succession on a plane substrate.

BACKGROUND OF THE INVENTION

Such fabrication conventionally makes use of a technique of depositing a material that is to constitute each layer on the substrate or on the stack inside an enclosure in which pressure is maintained at a low value (generally referred to as a "vacuum" enclosure), with the material being deposited by being "evaporated" or "sublimed" from a "source" of said material followed by "condensation" of the same material on a "target" which is constituted by the substrate or by the stack that is being built up; for this purpose, use is made of one or more electron or ion guns.

In order to obtain determined optical performance for the thin layer device, it is necessary to control the thickness of each deposited layer with sufficient accuracy to ensure that thickness error is minimized, and in particular is less than 1%.

For this purpose, various methods have been developed for monitoring the thickness of a layer while it is being deposited.

A "mechanical" method consists, prior to starting the deposition process, in placing a resonant structure such as a quartz crystal inside the vacuum enclosure close to a substrate that is to receive the thin layers; the "evaporated" material is then deposited on said structure as the deposition process advances in a manner that is assumed to be identical to the deposition of the material on the substrate; the deposit on the structure leads to a change in its resonant frequencies; by measuring at least one of these resonant frequencies it is possible to obtain an (indirect) indication concerning the thickness of the layer deposited on the resonant structure, and this thickness is assumed to be identical to the thickness deposited on the substrate; that indirect method of monitoring the thickness of thin layers being deposited does not enable the desired accuracy to be obtained.

There also exist "optical" methods of monitoring the thickness of thin layers that are being deposited, which methods are generally based on measuring the variation over time in the transmission or the reflection of a light beam directed on the stack while it is being built; such optical monitoring techniques include those in which the light beam is monochromatic, those in which the light beam is bichromatic, those in which the light beam is multichromatic, and those in which the light beam is "broad-band".

Techniques using one or two wavelengths are particularly suitable for monitoring optical thicknesses of quarterwave stacks; conversely, the technique using a broad-band beam is well adapted to stacks in which the optical thicknesses are not quarter wavelengths; in the monochromatic technique, a transmission extremum is sought, generally by computing the derivative with respect to time of transmission, and an order to stop depositing material is issued when the derivative becomes zero; it is also possible to cause deposition to stop when the partial derivative of the transmission factor relative to the optical thickness becomes zero.

In a bichromatic technique, deposition is generally stopped as a function of the measured value of the difference in transmission at the two wavelengths under consideration.

In a broad-band technique, deposition is generally servo-controlled as a function of the difference between a predetermined transmission spectrum and a transmission spectrum as measured during deposition.

In a multichromatic technique, prior to performing deposition, a plurality of wavelengths are determined such that for each of them the transmission of a layer of the stack presents an extremum when the desired optical thickness is reached.

In practice, the thickness deposited on a reference substrate is monitored, and when a plurality of substrates are being deposited on a common support that is set into rotation, the reference substrate is at a distance from said substrates; as a result the accuracy of the monitoring is not sufficient.

U.S. Pat. No. 5,425,964 describes a broad-band optical monitoring method.

U.S. Pat. No. 4,311,725 describes a method and apparatus for measuring and controlling the deposition of a thin layer by combining a mechanical method and an optical or an electrical method: deposition is monitored on the basis of the ratio between a signal delivered by a crystal which is subjected to deposition and a signal representative of the transmittance, the reflectance, or the resistivity of the thin layer being deposited.

Although the known methods and apparatuses for monitoring the deposition of a thin layer can, in certain applications, present performance that is sufficient, other applications, and in particular the manufacture of optical bandpass filters of multilayer structure for processing telecommunications signals, require better performance.

OBJECTS AND SUMMARY OF THE INVENTION

An object of the invention is thus to provide an improved method and apparatus for monitoring vacuum deposition of thin layers.

In one aspect of the invention, an optical property such as transmittance or reflectance is measured on a plurality of thin layers (TL) or a plurality of stacks of thin layers which are being formed by vacuum deposition onto a plurality of substrates (or substrate portions), with measurements being performed by a plurality of light beams, each of said light beams being directed towards a respective one of said substrates; this makes it possible to determine said optical property for each of said TLs or for each of said TL stacks, and to control changes in and/or to interrupt deposition selectively for each of said TLs or said TL stacks.

By substantially simultaneous use of a plurality of monitoring light beams respectively associated with the thin layers being deposited on a plurality of substrates, it is possible to measure and control deposition individually on a plurality of substrates, thus making it possible to obtain improved uniformity in the deposits made in this way.

In a preferred embodiment, the monitoring light beams are obtained by splitting a single "primary" light beam so that the monitoring beams present characteristics which are homogeneous if not identical, thereby simplifying beam processing (after transmission or reflection by the devices being fabricated.

The single primary beam can be split into a plurality of monitoring beams by time division ; this can be achieved quite simply by moving the substrates inside the vacuum enclosure during the deposition process so that each of the substrates (stacks) is brought in succession onto the path of said single beam; in this way, the substrates or stacks to be monitored form a shutter because they are in motion, and the reflected or transmitted beam forms in succession as many monitoring beams as there are substrates (or stacks) that have passed through it.

The substrates or stacks preferably move in substantially continuous manner around a closed outline of circular shape so that all of the substrates are maintained at a substantially constant distance from the source, thereby encouraging continuous and uniform deposition of the material from which the thin layer is being formed; for this purpose, the substrates can be mounted on a support in the form of a circular ring that is set into uniform rotation about its axis of symmetry, throughout the duration of deposition.

In another aspect of the invention, in a method of fabricating a batch comprising a plurality of thin layer optical components by vacuum deposition, in which all of the components are placed on a common support that is mounted to rotate inside the vacuum enclosure, the substrates are placed on the support in such a manner as to ensure that they are situated at substantially the same height (or distance) from the source of material to be deposited, and during deposition, said optical property of at least one of said substrates is measured; by means of this method, the measurement performed is representative of how deposition is progressing on all of the substrates in the batch, and the accuracy of monitoring is better than when monitoring is performed on a reference that is remote from the substrates that are being coated.

To this end, in a preferred embodiment, the common rotary support is fitted with a hollow shaft within which the primary beam can propagate, and also with a member for deflecting the primary beam, such as a periscope secured to the support, so as to deflect the primary beam and direct it in such a manner as to cause it to pass through one of the substrates placed on the support.

The invention makes it possible to remedy the disparities observed between the optical performances of the various thin film devices in a single batch (being fabricated simultaneously) and when thickness monitoring is performed by taking measurements on a single reference device.

The primary beam is preferably caused to intercept each substrate or stack at a constant frequency which is high enough to ensure several hundreds, thousands, or tens of thousands of such interceptions while a single thin layer is being deposited; in particular, 900 to 90,000 interceptions are involved for each thin layer.

Thus, for each stack, several hundreds or thousands of measurements of said optical property are performed, thereby making it possible to monitor the optical thickness of the deposited layer with accuracy that is better than 1%.

Said time division of the primary beam to form a plurality of monitoring beams can also be obtained by causing said primary beam to perform a scanning movement over said stacks; under such circumstances, the stacks can themselves be mounted so as to be stationary or so as to move within the enclosure.

In a variant embodiment, the monitoring beams can be formed by frequency division of the primary beam; to this end, it is possible in particular to place a prism on the path of the primary beam so as to form a plurality of mono- or polychromatic beams on the basis of a single primary polychromatic beam.

In another variant embodiment, space division is performed on the primary beam, e.g. by using semireflecting plates.

The various means for splitting the primary beam into a plurality of monitoring beams can be combined with one another; they can also be used to split a plurality of primary beams.

In a method of the invention, it is possible to use said mono-, bi-, multichromatic or broad-band optical techniques; nevertheless, it is preferable to use a mono- or bichromatic technique when fabricating narrow band wavelength division multiplex (WDM) filters, the multichromatic technique when fabricating antireflection filters, and the broad-band technique when fabricating components that are required to present a particular spectrum.

In order to simplify the opto-mechanical implementation of the manufacturing apparatus, the beam splitter is preferably mounted inside the vacuum enclosure.

According to another aspect of the invention, means are also provided and used to selectively modify the rate of deposition on the various substrates or stacks forming a batch and processed simultaneously in the enclosure.

For this purpose, it is preferable to mount the substrates or stacks on a common support, in particular a support in the form of a ring mounted to rotate inside the enclosure in such a manner as to ensure that the substrates are disposed relative to the source in a zone where the intensity of deposition is identical (homogeneous); various means can be used to selectively modify the rate of deposition on the various substrates fixed on the common support: in a first embodiment, a screen is provided for each substrate and means are provided for selectively actuating each screen as a function of a signal or a data item representative of said optical property measured by the monitoring beam associated with said substrate or stack, thereby causing deposition to be stopped selectively.

In another embodiment, the means for individually modifying deposition rate on each of the substrates being treated simultaneously comprise means for moving each substrate relative to the source of material to be deposited; it has been found that moving a stack through a small amplitude inside the enclosure can enable the rate of deposition on said stack to be modified significantly; in particular, this small amplitude displacement can serve to modify the direction, or most preferably the distance of the target relative to the source, or indeed relative to a deposition activator device, such as an ion gun or an electron gun.

Such individual displacement of the substrate or stack can be obtained by making provision for each substrate to be fixed on a shifting or steering device which is itself fixed on the support which is common to the substrates; said shifting device can be in the form of a piezoelectric spacer interposed between the substrate and the common support; in a variant, each substrate can be fixed to the common support via a mechanical structure enabling the substrate to be placed in at least two different stable positions; in particular, it can comprise a tilting or cam system suitable for actuation by a lever (or stud).

In order to control the substrate displacement means individually so as to modify the rate of deposition on the substrate, means are provided for carrying at least one control signal issued by an electronic device as a function of data (or signal) processing performed on the measurement signal representing said optical property.

Given that the electronic device for monitoring and controlling deposition is situated outside the vacuum enclosure, and that the means for displacing each substrate individually are placed inside the enclosure, the signals for actuating the substrate displacement means or the screen activation means must pass through the wall of the enclosure; this can be done without contact, e.g. by a magnetic effect; alternatively, the signals can be conveyed by electrical conductors; under such circumstances, and when the common support is mounted to rotate inside the enclosure, it is possible to provide a rotary contactor device.

These means can be used in combination with the screens associated with each of the substrates so as to continue deposition selectively on substrates which are not shielded by their respective screens while stopping deposition on those substrates which are shielded by the presence of their screens.

Once evaporation and deposition have been stopped on all of the substrates, it is also possible to reduce selectively the thickness that has already been deposited on one of the substrates by deactivating its screen in order to make the substrate accessible to radiation from an ion gun for sputtering, while leaving the other substrates shielded by their respective screens.

Because deposition on the substrates within a single batch is controlled selectively and individually, it is possible simultaneously to manufacture components having optical characteristics that are different, said characteristics being recorded prior to fabrication in a memory associated with the electronic deposition control device; this makes it possible to manufacture small numbers of components at reduced cost.

BRIEF DESCRIPTION OF THE DRAWINGS

Other characteristics and advantages of the invention appear from the following description which refers to the accompanying drawings, which show preferred embodiments of the invention in non-limiting manner.

MORE DETAILED DESCRIPTION

Figure 1:
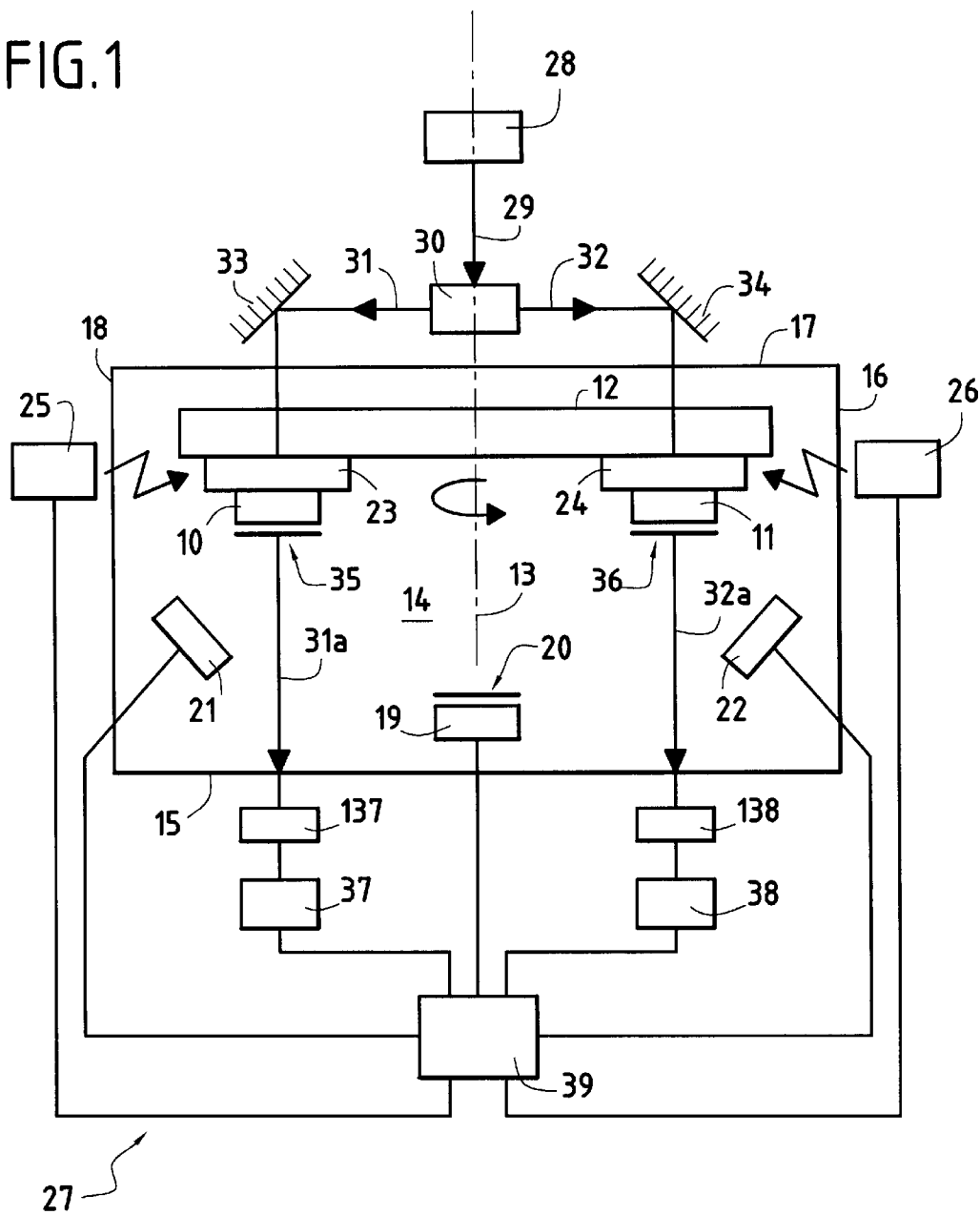
FIG. 1 is a diagrammatic side view of apparatus for fabricating optical filters by depositing thin layers in accordance with the invention.

With reference to FIG. 1 in particular, two substrates 10 and 11 are supported by a common support 12 which is mounted to rotate (about an axis 13) inside a vacuum enclosure 14.

The enclosure 14 is defined by airtight walls 15 to 18; they enclose a support 19 for a source 20 of material to be deposited on the substrates, together with two ion guns 21, 22. Respective mechanisms 23, 24 are interposed between the substrates 10, 11 and the rotary support 12 common to the substrates; each shifting mechanism 23, 24 can be activated remotely and without contact through the walls 18, 16 via respective actuators 25, 26 disposed in register with the corresponding shifting mechanisms; when a mechanism 23, 24 is activated, it serves to displace the corresponding substrates 10, 11 from a first position to a second position in which the rate of deposition on the substrate is different from the rate of deposition in the first position, because the substrate is moved away from (or on the contrary towards) the source 19, 20.

The manufacturing apparatus 27 comprises a device 28 for emitting a primary light beam 29 which propagates parallel to (and/or on) the axis of rotation 13 of the support 12.

The radiation 29 emitted by the source 28 can be monochromatic if the source is a laser source, or broad-band if the source is a source of white light; the radiation can be pulsed, e.g. by interposing a chopper (not shown) on the path of the beam 29 to produce a pulse rate that is large relative to the rate at which the substrates pass through the monitoring beam; this can serve to improve the measurement signal-to-noise ratio.

A beam splitter 30 is placed on the path of the beam 29 and outputs two light beams 31, 32 which are directed towards respective substrates 10 and 11 via light guides 33, 34 (mirrors).

The monitoring beam 31, 32 passes through the corresponding substrate 10, 11 and through the stack 35, 36 of thin layers that is being deposited, while propagating substantially at normal incidence to the plane of the substrate and the thin layers; on output, each incident monitoring beam 31, 32 becomes a transmitted beam 31a, 32a which is measured by a respective detector 37, 38, e.g. constituted by a spectrograph.

An optical filter such as a monochromator 137, 138 is preferably provided on the path of each beam 31a, 32a upstream from each detector 37, 38; this filter serves to reduce and eliminate at least a fraction of the interfering radiation, in particular due to ambient light which could otherwise disturb the measurements performed by the detector.

An electronic monitoring and control unit 39 for the apparatus is connected to the source 19, 20 to cause the material for deposition to be evaporated, and to the guns 21, 22 to modulate the rate of deposition on the substrates; the unit 39 is also connected to the actuators 25, 26 to control the displacement of each substrate, and to the detectors 37, 38 to analyze the signals delivered by said detectors, which signals are representative of the optical property of each stack that is being fabricated.

By way of example, the monochromatic primary beam is emitted continuously and it is time divided or space divided by the beam splitter 30; each monitoring monochromatic beam 31, 32 is modified on passing through the stack; the unit 39 analyzed the transmittance of the stack by comparing the signals that are delivered by the detectors with recorded data (or alternatively an additional detector—not shown—can be placed on the path of each monitoring beam 31, 32, upstream from the stack and can be connected to the unit 39 in order to enable transmittance to be determined).

The variation over time in the advancing deposition process is analyzed using the usual techniques as mentioned in the introduction so as to determine individually for each substrate the optical thickness of the layer that is being deposited, thus enabling the above-described means to be put into operation to reduce deposition rate and/or to stop deposition.

In a variant (not shown) of the apparatus shown in FIG. 1, only one (switched) monitoring beam need be provided.

Figure 2:
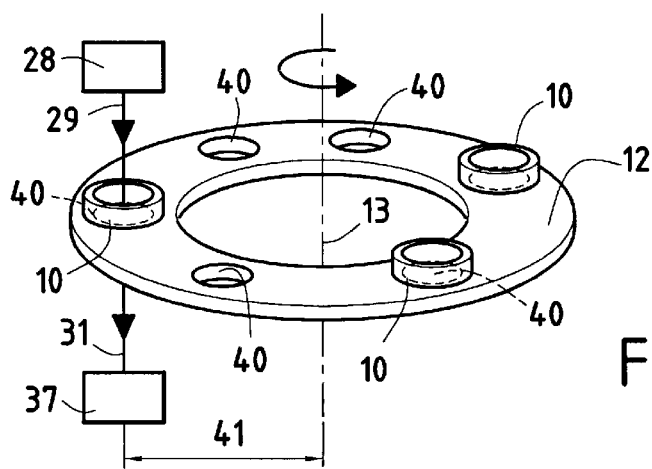
FIG. 2 is a fragmentary diagrammatic view of a variant embodiment of the apparatus.

With reference to FIG. 2, the substrate support 12 is mounted to rotate about the axis 13 and is in the form of a ring pierced by six windows that are transparent for the beams 29, 31; the support is suitable for receiving six substrates 10, of which only three are shown in FIG. 2. In this embodiment, the primary beam 29 emitted by the source 28 passes in succession through the substrates as they cross through the line between the source 28 and the detector 37. For this purpose, the distance 41 between the axis of the beam 29 and the axis 13 is equal to the distance between the windows 40 in the support 12 and the axis 13.

Figure 3:
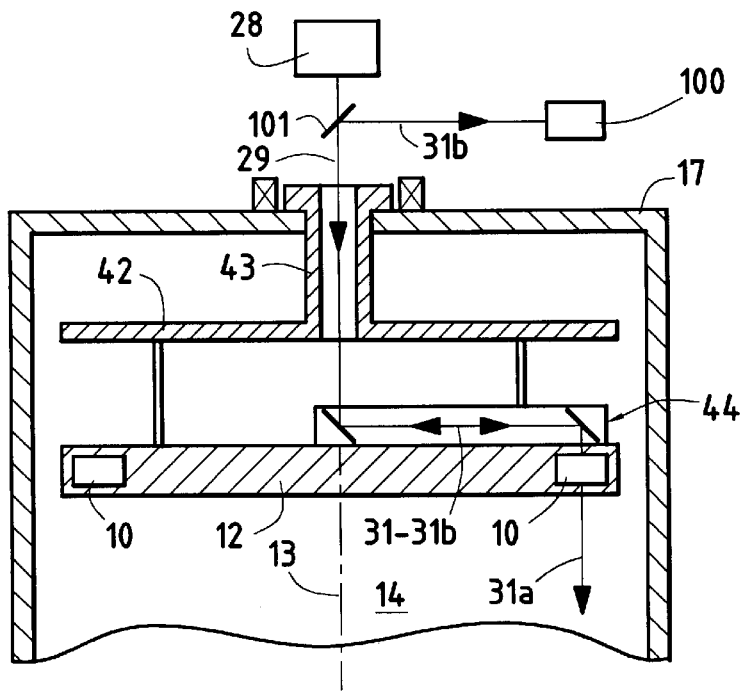
FIG. 3 is a fragmentary diagrammatic view of another variant embodiment of means for systematic optical monitoring of the substrates in a batch of substrates under treatment.

With reference to FIG. 3, the support 12 carrying the substrate 10 is suspended from a disk-shaped supporting turntable 42 that is secured to a hollow shaft 43 on the axis 13, the assembly being mounted to rotate about said axis by means of an airtight bearing provided in the wall 17 of the enclosure 14; the beam 29 emitted by the source 28 propagates along the axis 13 inside the hollow shaft to the inlet of a periscope deflector device 44 which is mounted on the support 12 and is associated with a substrate.

The mirror deflector device 44 enables the monitoring beam to be taken from the beam propagation axis 13 to a point that is normal relative to the substrate 10 and at a distance from the axis 13; the device 44 is fixed to the support 12; the support 12 can be fitted with a plurality of identical deflector devices 44; such mirror devices also enable the portion 31$b$ of the beam 31 which is reflected by the substrate to be guided to a semireflecting plate 101 which directs the reflected beam to the inlet of an optical detector 100; this enables the reflectance of the component 10 to be measured continuously, and this measurement can be combined with the measurement of the transmittance of the same component as performed using the transmitted beam 31$a$; this combined measurement of two optical properties of the components being fabricated enables the accuracy of the optical monitoring to be improved.

Figure 4:
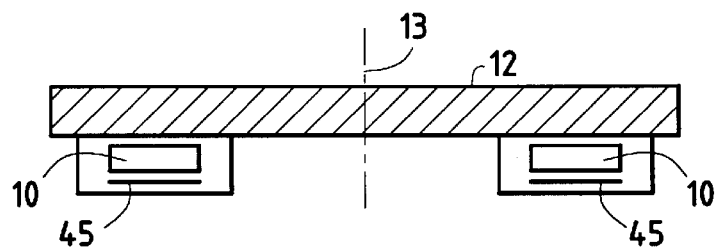
FIGS. 4 to 6 are diagrams of three variant embodiments of the means for individually controlling deposition on each substrate.

In the embodiment of FIG. 4, a moving and/or removable screen 45 is associated with each substrate in such a manner as to be capable of being placed in register with each substrate so as to cause deposition to stop, and to be moved away from the substrate so as to allow deposition to take place.

Figure 5:
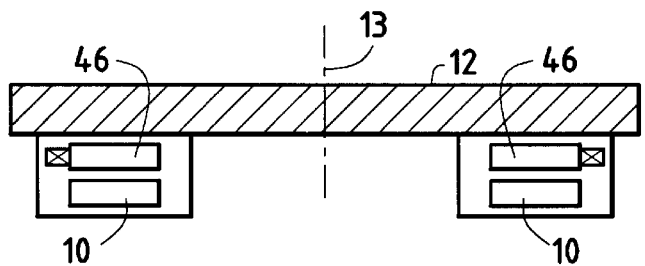

In the embodiment of FIG. 5, a piezoelectric spacer 46 is inserted between the support 12 and each substrate 10 so as to enable the substrate to be moved as a function of control signals, thereby having an influence on the rate of deposition.

Figure 6:
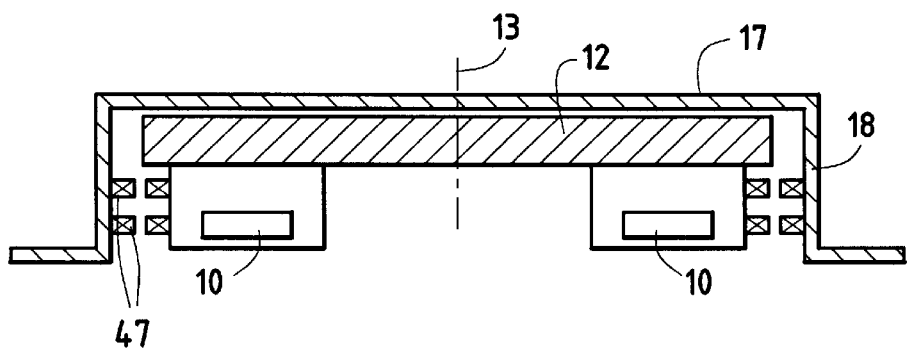

In a variant shown in FIG. 6, this adjustable spacer can be replaced by a mechanical interface 48 interconnecting each substrate with the support 12, the interface enabling the substrate to move between a first position and a second position, e.g. by tilting under the control of studs 47 projecting from the inside face of the wall 18 of the enclosure 14.

In the circumstances corresponding specifically to the system of FIGS. 1 and 2 in which one of the detectors 37, 38 is fixed and receives in succession monitoring signals transmitted by a plurality of substrates, it is necessary to demultiplex the monitoring beam; this can be done, for example, under the control of a synchronization signal associated with the rotation of the substrate support, or by dynamic windowing and autocorrelation of the signal delivered by the detector 37, 38.

The rotary frequency of the support 12 preferably lies in the range 1 hertz (Hz) to 60 Hz, and the frequency at which the signal delivered by the detectors 37, 38 is sampled is preferably greater than or equal to 10 kilohertz (kHz) and in particular lies in the range 10 kHz to 100 kHz.

By using the measurement means and by individually controlling deposition of material on each of the substrates in a batch, it is also possible to increase the number of substrates that can be treated simultaneously and correspondingly to increase the total area of a treated substrate.

What is claimed is:

1. Apparatus for depositing thin layers on a plurality of subtrates, the apparatus comprising means for producing a light beam for monitoring optical thicknesses of said plurality of substrates, and
means for modifying a rate of deposition on each substrate of said plurality of substrates as a function of an optical property of each substrate as measured during deposition with the help of a plurality of monitoring light beams.

2. Apparatus according to claim 1, further comprising a rotary support common to said plurality of substrates and a moving or deformable spacer extending between said rotary support and each substrate of said plurality of substrates, so as to enable each substrate to be displaced selectively in order to modify a rate of deposition thereon.

3. Apparatus according to claim 1, further comprising:
at least one optical sensor responsive to said monitoring light beam(s),
an electronic unit connected to said at least one optical sensor, and
means for modifying the rate of deposition on the substrates under control of said electronic unit,
said control being performed as a function of signals delivered by the detector(s) and representative of transmittance of reflectance of said substrate of said plurality of substrates.

4. Apparatus according to claim 1, further comprising a plurality of screens, each screen being respectively associated with each substrate of said plurality of substrates, the screens being suitable for being activated as a function of signals delivered by one or more optical detectors sensitive to said monitoring light beam.

5. Apparatus according to claim 1, the apparatus comprising:
a vacuum enclosure;
a source of material to be evacuated;
a rotary support for supporting said plurality of substrates;
an ion gun,
said source, said support, and said gun being located inside the enclosure;
an emitter producing a primary light beam;
a beam splitter for forming a plurality of monitoring light beams from the primary light beam;
a detector responsive to at least one of the monitoring light beams;
a plurality of actuators suitable for displacing one of said substrates or a screen; and
an electronic unit connected to said source, to said gun, to said detector, and to said actuators to modify a deposition rate selectively on said plurality of substrates as a function of signals delivered by said detector.

6. Apparatus according to claim 1, further comprising:
a vacuum enclosure,
an emitter producing a primary light beam, the emitter being disposed outside the vacuum enclosure,
an optical window provided through a wall of the enclosure,
a support common to said plurality of substrates, the support being mounted to rotate inside the enclosure according to an axis of rotation, a rotary shaft for the support, which shaft is hollow to enable said light beam to propagate along said axis of rotation, and a device for deflecting and guiding the beam to one of the substrates, which device is secured to the support.

7. Apparatus according to claim 1, further comprising an emitter producing a primary light beam for optical monitoring, a detector responsive to a monitoring beam transmitted by a substrate, and a detector responsive to a monitoring beam reflected by the substrate.

8. Apparatus for depositing thin layers on a plurality of substrates, the apparatus comprising means for producing a light beam for monitoring optical thicknesses of said plurality of substrates, and a splitter for producing a plurality of monitoring beams from a single incident primary light beam.

9. Apparatus according to claim 8, further comprising a vacuum enclosure and a support common to said plurality of substrates and mounted to rotate about an axis, the support being in the form of a circular ring pierced by windows and being located inside said vacuum enclosure.

10. Apparatus for depositing thin layers on a plurality of substrates, the apparatus comprising means for producing a light beam for monitoring optical thicknesses of said plurality of substrates, and a rotary support common to said plurality of substrates and a moving or deformable spacer extending between said rotary support and each substrate of said plurality of substrates, so as to enable each substrate to be displaced selectively in order to modify a rate of deposition thereon.

11. Apparatus according to claim 10, further comprising:

at least one optical sensor responsive to said monitoring light beam(s), an electronic unit connected to said at least one optical sensor, and means for modifying the rate of deposition on the substrates under control of said electronic unit, said control being performed as a function of signals delivered by the detector(s) and representative of transmittance of reflectance of said substrate of said plurality of substrates.

12. Apparatus according to claim 10, further comprising a plurality of screens, each screen being respectively associated with each substrate of said plurality of substrates, the screens being suitable for being activated as a function of signals delivered by one or more optical detectors sensitive to said monitoring light beam.

13. Apparatus according to claim 10, further comprising:

a vacuum enclosure, an emitter producing a primary light beam, the emitter being disposed outside the vacuum enclosure, an optical window provided through a wall of the enclosure, a support common to said plurality of substrates, the support being mounted to rotate inside the enclosure according to an axis of rotation, a rotary shaft for the support, which shaft is hollow to enable said light beam to propagate along said axis of rotation, and a device for deflecting and guiding the beam to one of the substrates, which device is secured to the support.

14. Apparatus for depositing thin layers on a plurality of substrates, the apparatus comprising means for producing a light beam for monitoring optical thicknesses of said plurality of substrates, and at least one optical sensor responsive to said monitoring light beam(s), an electronic unit connected to said at least one optical sensor, and means for modifying the rate of deposition on the substrates under control of said electronic unit, said control being performed as a function of signals delivered by the detector(s) and representative of transmittance or reflectance of each substrate of said plurality of substrates.

15. Apparatus according to claim 14, further comprising a plurality of screens, each screen being respectively associated with each substrate of said plurality of substrates, the screens being suitable for being activated as a function of signals delivered by one or more optical detectors sensitive to said monitoring light beam.

16. Apparatus according to claim 14, further comprising:

a vacuum enclosure, an emitter producing a primary light beam, the emitter being disposed outside the vacuum enclosure, an optical window provided through a wall of the enclosure, a support common to said plurality of substrates, the support being mounted to rotate inside the enclosure according to an axis of rotation, a rotary shaft for the support, which shaft is hollow to enable said light beam to propagate along said axis of rotation, and a device for deflecting and guiding the beam to one of the substrates, which device is secured to the support.

17. Apparatus for depositing thin layers on a plurality of substrates, the apparatus comprising means for producing a light beam for monitoring optical thicknesses of said plurality of substrates, and a plurality of screens, each screen being respectively associated with each substrate of said plurality of substrates, the screens being suitable for being activated as a function of signals delivered by one or more optical detectors sensitive to said monitoring light beam.

18. Apparatus for depositing thin layers on a plurality of substrates, the apparatus comprising means for producing a light beam for monitoring optical thicknesses of said plurality of substrates, and a vacuum enclosure;

a source of material to be evacuated;

a rotary support for supporting said plurality of substrates;

an ion gun;

said source, said support, and said gun being located inside the enclosure;

an emitter producing a primary light beam;

a beam splitter for forming a plurality of monitoring light beams from the primary light beam;

a detector responsive to at least one of the monitoring light beams;

a plurality of actuators suitable for displacing one of said substrates or a screen; and an electronic unit connected to said source, to said gun, to said detector, and to said actuators to modify a deposition rate selectively on said plurality of substrates as a function of signals delivered by said detector.

19. Apparatus for depositing thin layers on a plurality of substrates, the apparatus comprising means for producing a light beam for monitoring optical thicknesses of said plurality of substrates, and a vacuum enclosure;

an emitter producing a primary light beam, the emitter being disposed outside the vacuum enclosure, an optical window provided through a wall of the enclosure, a support common to said plurality of substrates, the support being mounted to rotate inside the enclosure according to an axis of rotation, a rotary shaft for the support, which shaft is hollow to enable said light beam to propagate along said axis of rotation, and a device for deflecting and guiding the beam to one of the substrates, which device is secured to the support.

20. Apparatus according to claim 19, further comprising a plurality of screens, each screen being respectively associated with each substrate of said plurality of substrates, the screens being suitable for being activated as a function of signals delivered by one or more optical detectors sensitive to said monitoring light beam.

21. Apparatus for depositing thin layers on a plurality of substrates, the apparatus comprising means for producing a light beam for monitoring optical thicknesses of said plurality of substrates, and an emitter producing a primary light beam for optical monitoring, a detector responsive to a monitoring beam transmitted by a substrate, and a detector responsive to a monitoring beam reflected by the substrate.

* * * * *